(12) United States Patent
Ahn et al.

(10) Patent No.: US 7,763,523 B2
(45) Date of Patent: Jul. 27, 2010

(54) METHOD FOR FORMING DEVICE ISOLATION STRUCTURE OF SEMICONDUCTOR DEVICE USING ANNEALING STEPS TO ANNEAL FLOWABLE INSULATION LAYER

(75) Inventors: Sang Tae Ahn, Gyeonggi-do (KR); Ja Chun Ku, Gyeonggi-do (KR); Eun Jeong Kim, Jeollanam-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/045,073

(22) Filed: Mar. 10, 2008

(65) Prior Publication Data

US 2009/0035917 A1    Feb. 5, 2009

(30) Foreign Application Priority Data

Aug. 3, 2007    (KR) ...................... 10-2007-0078233

(51) Int. Cl.
*H01L 21/76* (2006.01)

(52) U.S. Cl. .................. 438/425; 438/196; 438/186; 438/424; 438/364; 438/663; 257/295; 257/310; 257/763

(58) Field of Classification Search ................. 438/425, 438/196, 186, 424, 364, 663; 257/295, 310, 257/763

See application file for complete search history.

(56) References Cited

U.S. PATENT DOCUMENTS

| 5,719,416 A * | 2/1998 | Yoshimori et al. ........... 257/295 |
| 2008/0160716 A1* | 7/2008 | Seo et al. ..................... 438/425 |

FOREIGN PATENT DOCUMENTS

| KR | 2002-0071169 A | 9/2002 |
| KR | 10-0436495 A | 12/2002 |
| KR | 10-574731 A | 4/2004 |
| KR | 2005-0055324 A | 6/2005 |

* cited by examiner

*Primary Examiner*—Matthew Smith
*Assistant Examiner*—Wilner Jean Baptiste
(74) *Attorney, Agent, or Firm*—Ladas & Parry LLP

(57) ABSTRACT

A method for forming a device isolation structure of a semiconductor device using at least three annealing steps to anneal a flowable insulation layer is presented. The method includes the steps of forming a hard mask pattern on a semiconductor substrate having active regions exposing a device isolation region of the semiconductor substrate; etching the device isolation region of the semiconductor substrate exposed through the hard mask pattern, and therein forming a trench; forming a flowable insulation layer to fill a trench; first annealing the flowable insulation layer at least three times; second annealing the first annealed flowable insulation layer; removing the second annealed flowable insulation layer until the hard mask pattern is exposed; and removing the exposed hard mask pattern.

16 Claims, 7 Drawing Sheets

METHOD FOR FORMING DEVICE ISOLATION STRUCTURE OF SEMICONDUCTOR DEVICE USING ANNEALING STEPS TO ANNEAL FLOWABLE INSULATION LAYER

CROSS-REFERENCE TO RELATED APPLICATIONS

The present application claims priority to Korean patent application number 10-2007-0078233 filed on Aug. 3, 2007, which is incorporated herein by reference in its entirety.

BACKGROUND OF THE INVENTION

The present invention relates to a method for forming the device isolation structure of a semiconductor device, and more particularly, to a method for forming the device isolation structure of a semiconductor device which can prevent or at least minimize defects such as dislocation from occurring in a semiconductor substrate.

The trend in the development of semiconductor manufacturing technologies has been to develop the high speed operation and the high integration so that the semiconductor devices are rapidly and efficiently produced. It follows that this demand toward fine patterns and highly precise pattern dimensions will remain high and will likely gradually increase. This demand is applied not only to the patterns formed in device regions but also to device isolation structures which occupy a relatively large area.

In the conventional art, while a LOCOS (local oxidation of silicon) process has been used as a method for forming a device isolation structure, a bird's beak is likely to be formed on the edge of the upper end of the device isolation structure which is formed using the LOCOS fabrication process. Because of this fact, the LOCOS fabrication process exhibit undesirable drawbacks such as limiting the size reduction of an active region.

In a STI (shallow trench isolation) process, a device isolation structure can be formed while preventing the formation of a bird's beak, and therefore, the size of an active region can be secured, whereby a highly integrated semiconductor device can be realized. Due to this fact, the STI process is currently adopted in most semiconductor devices.

The STI process is implemented in a manner such that a device isolation region of a semiconductor substrate is etched to form a trench and an insulation layer is filled in a trench.

In the STI process, in general, a $SiO_2$ layer or an $O_3$-TEOS (tetra ethyl ortho silicate) layer is used as an insulation layer for filling a trench. The insulation layer is filled in a trench through CVD (chemical vapor deposition) or HDP-CVD (high density plasma-chemical vapor deposition).

Meanwhile, as semiconductor devices trend toward high integration, the aspect ratio of a trench increases. In this regard, in the case of a semiconductor device having a sub-100 nm level, a method has been proposed, in which a PSZ (polysilazane) layer as a flowable insulation layer is used as an insulation layer for filling a trench.

Hereafter, a conventional method for forming the device isolation structure of a semiconductor device, in which a PSZ layer is used as an insulation layer for filling a trench, will be schematically described.

After a pad oxide layer and a pad nitride layer are sequentially formed on a semiconductor substrate, the pad nitride layer is patterned. The pad oxide layer and the semiconductor substrate are etched using the patterned pad nitride layer as a hard mask, and as a result, a trench is formed in the semiconductor substrate. Then, after a sidewall oxide, a linear nitride layer and a linear oxide layer are sequentially formed on the semiconductor substrate including a trench, perhydro-polysilazane is coated through an SOD (spin-on dielectric) process to fill a trench.

The perhydro-polysilazane is baked and the solvent contained in the perhydro-polysilazane volatilizes, by which a PSZ layer is formed. Next, the PSZ layer is annealed and is thereby converted into a $SiO_2$ layer. The $SiO_2$ layer is then densified. The densified $SiO_2$ layer is CMPed (chemically and mechanically polished) until the pad nitride layer is exposed. The exposed pad nitride layer and the pad oxide layer are sequentially removed, as a result of which a trench type device isolation structure is formed.

FIG. 1 is a diagrammatic view explaining a baking and annealing procedure in the formation of the device isolation structure of a semiconductor device according to the conventional art.

Referring to FIG. 1, after the semiconductor substrate, on which the perhydro-polysilazane is filled in a trench, is loaded into a process chamber, the perhydro-polysilazane is baked at a temperature of 150° C., for example, 150~200° C., for 3 minutes. The solvent contained in the perhydro-polysilazane volatilizes by the baking, and as a result, the PSZ layer is formed.

The PSZ layer is first annealed at a temperature of 300~400° C. for about 60 minutes. The first annealing is implemented as wet annealing in the atmosphere containing water vapor ($H_2O$). The PSZ layer, which is constituted by the solute of the perhydro-polysilazane (($SiH_2NH)_n$ where n=a positive integer), is converted into the $SiO_2$ layer by the first annealing.

The $SiO_2$ layer is second annealed at a relatively high temperature of 750~900° C. The second annealing is also implemented as wet annealing in the atmosphere containing water vapor ($H_2O$). The $SiO_2$ layer is densified by the second annealing. Then, the semiconductor substrate is unloaded from the process chamber.

However, in the conventional art as described above, after the first annealing is implemented, a temperature abruptly rises in the second annealing which is implemented at the relatively high temperature. Due to an abrupt rise in temperature, the semiconductor substrate excessively shrinks in volume.

FIG. 2 is the photograph of a semiconductor device, illustrating the defects occurring in the conventional art.

If the volume of a semiconductor substrate excessively shrinks, stress is induced in the semiconductor substrate. As a result, as can be seen from FIG. 2, defects such as dislocation occur in the active region of the semiconductor substrate due to the stress. Also, if the defects occur in the active region of the semiconductor substrate, the characteristics of a semiconductor device are degraded, and the manufacturing yield of the semiconductor device decreases.

Meanwhile, a method for preventing an abrupt temperature rise during annealing of a PSZ layer has been disclosed in Korean Patent No. 0574731. In this method, after a PSZ layer is annealed at a low temperature and converted into a $SiO_2$ layer, the converted $SiO_2$ layer is CMPed and then annealing is implemented at a high temperature.

Nevertheless, in this case, while the annealing is implemented at a high temperature, because oxygen or moisture leaks into a linear nitride layer which is partially lost by CMP and thereby the active regions of a semiconductor device are partially oxidized, GOI (gate oxide integrity) is degraded.

Thus, it is difficult to actually apply the method to a process for manufacturing a semiconductor device.

SUMMARY OF THE INVENTION

Embodiments of the present invention are directed to a method for forming the device isolation structure of a semiconductor device which can prevent or at least minimize defects such as dislocation from occurring in a semiconductor substrate.

Also, embodiments of the present invention are directed to a method for forming the device isolation structure of a semiconductor device which can result in improving the characteristics of the semiconductor device.

Further, embodiments of the present invention are directed to a method for forming the device isolation structure of a semiconductor device which can result in increasing the manufacturing yield.

One method for forming a device isolation structure of a semiconductor device comprises the steps of forming a hard mask pattern on a semiconductor substrate having active regions that exposes a device isolation region of the semiconductor substrate; etching the device isolation region of the semiconductor substrate, which are exposed through the hard mask pattern, and therein forming a trench; forming a flowable insulation layer to fill a trench; first annealing the flowable insulation layer at least three times; second annealing the first annealed flowable insulation layer; removing the second annealed flowable insulation layer until the hard mask pattern is exposed; and removing the exposed hard mask pattern.

After the step of forming a trench and before the step of forming the flowable insulation layer to fill a trench, the method further comprises the steps of forming sequentially a sidewall oxide, a linear nitride layer and a linear oxide layer on a surface of the semiconductor substrate.

The cleaning is implemented using at least one solution among SC-1 solution, BOE solution, HF solution, and SPM solution.

The flowable insulation layer is formed as a PSZ layer.

The step of forming the flowable insulation layer comprises the steps of coating a flowable insulation layer through SOD to fill a trench; and baking the flowable insulation layer.

The baking is implemented at a temperature of 50~150° C. for 1~10 minutes.

The first annealing is implemented as wet annealing in an $H_2O$ atmosphere.

The step of first annealing the flowable insulation layer at least three times comprises the steps of first sub-annealing the flowable insulation layer at a temperature of 300~400° C.; second sub-annealing the first sub-annealed flowable insulation layer at a temperature of 600~700° C.; and third sub-annealing the second sub-annealed flowable insulation layer at a temperature of 800~950° C.

The first sub-annealing is implemented under a pressure of 300~700 Torr for 30~120 minutes.

The first sub-annealing can be implemented two times and each first sub-annealing is implemented for 15~60 minutes.

The second sub-annealing is implemented under a pressure of 400~760 Torr for 20~120 minutes.

The third sub-annealing is implemented under a pressure of 400~760 Torr.

The semiconductor substrate formed with the flowable insulation layer is loaded into a furnace at a temperature of 150~200° C. to be first annealed and second annealed, and the semiconductor substrate having undergone the first annealing and the second annealing is unloaded from the furnace at a temperature of 200~600° C.

The step of second annealing the first annealed flowable insulation layer is implemented as dry annealing in an $N_2$ or $O_2$ atmosphere at a temperature of 850~980° C. for 5~120 minutes.

The step of first annealing the flowable insulation layer and the step of second annealing the first annealed flowable insulation layer are implemented in situ.

The step of removing the second annealed flowable insulation layer until the hard mask pattern is exposed is implemented through CMP.

After the step of removing the hard mask pattern, the method further comprises the step of densifying the flowable insulation layer.

The step of densifying the flowable insulation layer is implemented through annealing in an $N_2$ or $O_2$ atmosphere at a temperature of 800~980° C. for 30~120 minutes.

DESCRIPTION OF SPECIFIC EMBODIMENT

In an embodiment of the present invention, perhydro-polysilazane is baked, and as a result, the solvent contained in the perhydro-polysilazane volatilizes, by which a PSZ layer is formed. The PSZ layer is annealed at least three times and is thereby oxidated into a $SiO_2$ layer. Then, the $SiO_2$ layer is annealed and is densified thereby.

Therefore, due to the fact that annealing for oxidating the PSZ layer into the $SiO_2$ layer is implemented at least three times, an abrupt temperature rise can be avoided or at least suppressed while implementing the annealing. Accordingly, in the present invention, the concomitant excessive volume shrinkage of the semiconductor substrate brought about due to the abrupt temperature changes can be minimized.

Consequently, in the present invention, it is possible to prevent stress from being induced in the semiconductor substrate due to the excessive volume shrinkage. Also, in the present invention, it is possible to prevent defects such as dislocation from occurring in the active region of the semiconductor substrate due to the stress. Accordingly, in the present invention, the characteristics of a semiconductor device can be improved and the manufacturing yield of the semiconductor device can also be increased.

Figure 1:
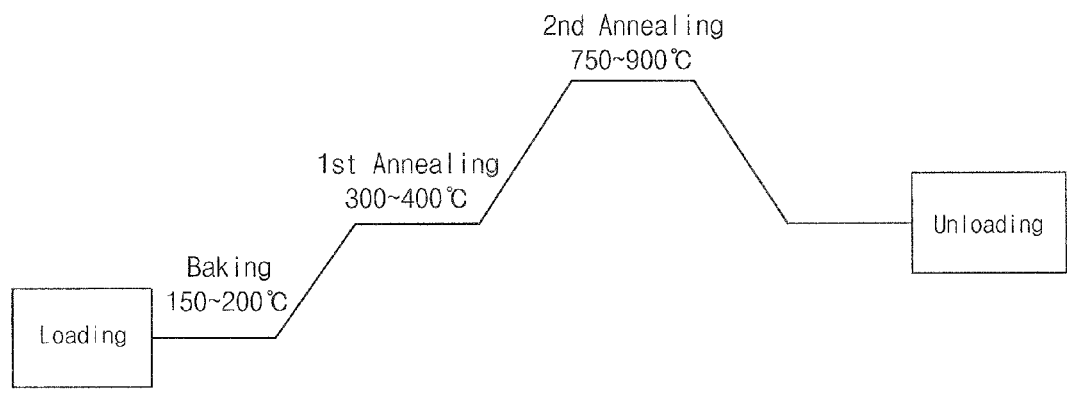
FIG. 1 is a diagrammatic view explaining a baking and annealing procedure according to a conventional art.
Figure 2:
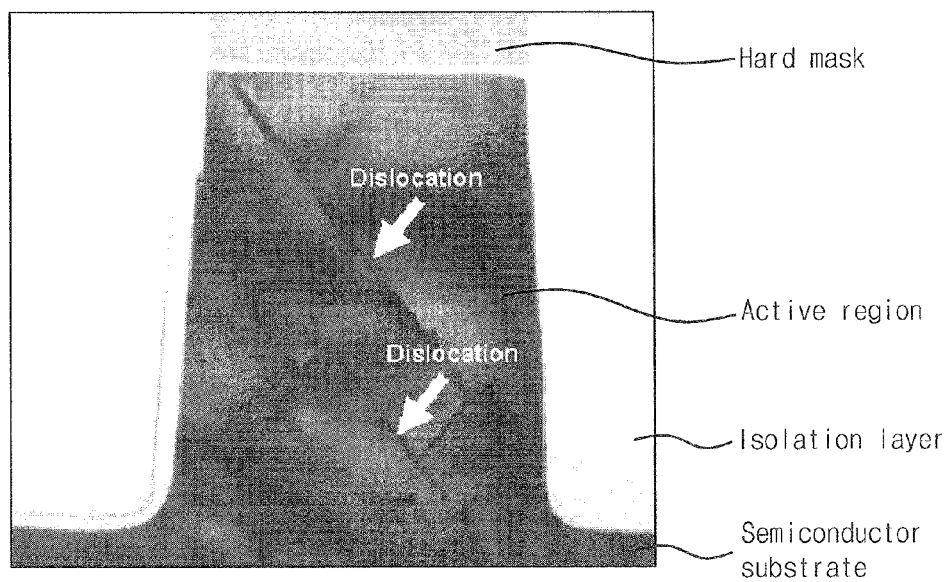
FIG. 2 is the photograph of a semiconductor device, illustrating the defects occurring in the conventional art.
Figure 3:
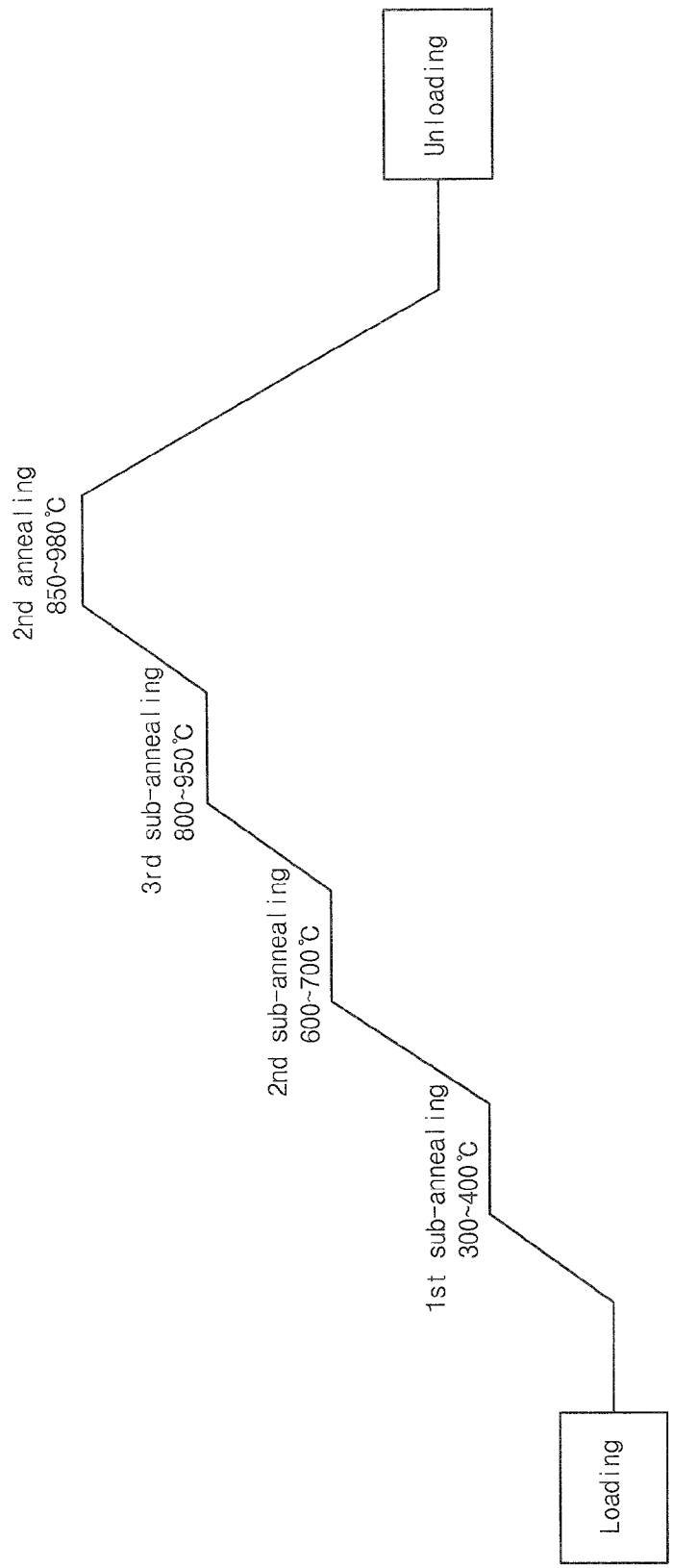
FIG. 3 is a diagrammatic view explaining a baking and annealing procedure according to the present invention.

Hereafter, a baking and annealing procedure according to the present invention will be described in detail with reference to FIG. 3.

After a semiconductor substrate, which has a trench and is filled with perhydro-polysilazane in a trench, is loaded into a process chamber at a temperature of 150~200° C., the perhydro-polysilazane is baked at a temperature of 50~150° C. The baking is implemented for 1~10 minutes, and the solvent contained in the perhydro-polysilazane volatilizes by the baking, and as a result, a PSZ layer is formed.

The PSZ layer is first annealed. The first annealing comprises first sub-annealing, second sub-annealing and third sub-annealing. The first sub-annealing is implemented at a temperature of 300~400° C. under a pressure of 300~700 Torr for 30~120 minutes. The first sub-annealing may be implemented in two times, each first sub-annealing is implemented for 15~60 minutes.

The first sub-annealed PSZ layer is second sub-annealed at a temperature of 600~700° C. under a pressure of 400~760 Torr for 20~120 minutes. The second sub-annealed PSZ layer is third sub-annealed at a temperature of 800~950° C. under a pressure of 400~760 Torr.

Here, the first, second and third sub-annealing is implemented as wet annealing in the atmosphere containing water vapor ($H_2O$). The PSZ layer, which is constituted by the solute of the perhydro-polysilazane (($SiH_2NH$)n where n is a positive integer), is converted into a $SiO_2$ layer by the first through third sub-annealing.

The $SiO_2$ layer is second annealed at a relatively high temperature of 850~980° C. The second annealing is implemented in an $N_2$ or $O_2$ atmosphere for 5~120 minutes. The $SiO_2$ layer is densified by the second annealing. The semiconductor substrate having undergone the second annealing is unloaded from the process chamber at a temperature of 200~600° C.

Therefore, due to the fact that annealing for oxidating the PSZ layer into the $SiO_2$ layer is implemented at least three times, an abrupt temperature rise can be avoided or at least suppressed while implementing the annealing. As a result, in the present invention, the concomitant excessive volume shrinkage of the semiconductor substrate associated with abrupt temperature changes can be minimized.

Consequently, in the present invention, it is possible to prevent or minimize stress from being induced in the semiconductor substrate due to the excessive volume shrinkage. Also, in the present invention, it is possible to prevent or at least minimize defects such as dislocation from occurring in the active region of the semiconductor substrate due to the stress. Accordingly, in the present invention, the characteristics of a semiconductor device can be improved and the manufacturing yield of the semiconductor device can increase.

Hereinbelow, a method for manufacturing the device isolation structure of a semiconductor device in accordance with an embodiment of the present invention will be described in detail with reference to FIGS. 4A through 4J.

Figure 4A:
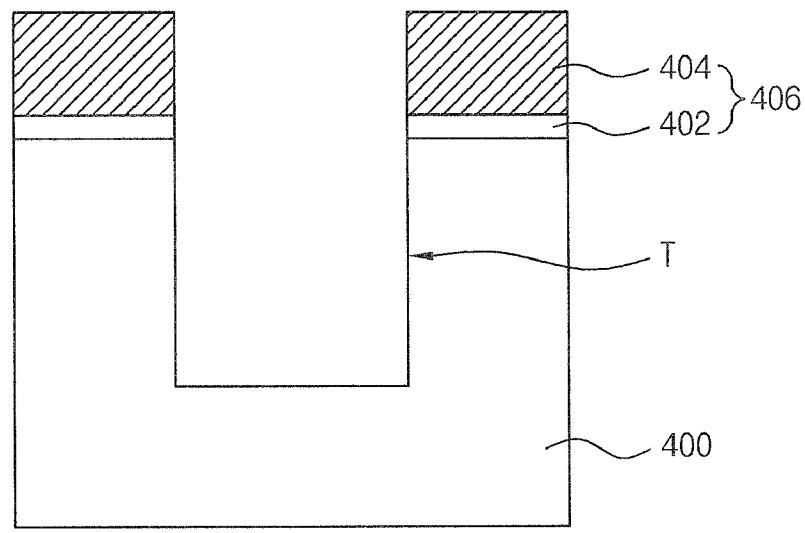
FIGS. 4A through 4J are cross-sectional views illustrating the processes of a method for manufacturing the device isolation structure of a semiconductor device in accordance with an embodiment of the present invention.

Referring to FIG. 4A, a hard mask 406 composed of the stack of a pad oxide layer 402 and a pad nitride layer 404 is formed on a semiconductor substrate 400 which has active regions and a device isolation region. A mask pattern (not shown) for forming a trench for device isolation is formed on the pad nitride layer 404.

The pad nitride layer 404 is patterned using the mask pattern as an etch mask, and then, the mask pattern is removed. Portions of the pad oxide layer 402 and the device isolation region of the semiconductor substrate 400, which are placed under the patterned pad nitride layer 404, are etched using the patterned pad nitride layer 404 as an etch mask, and as a result, a trench T are formed in the semiconductor substrate 400.

Figure 4B:
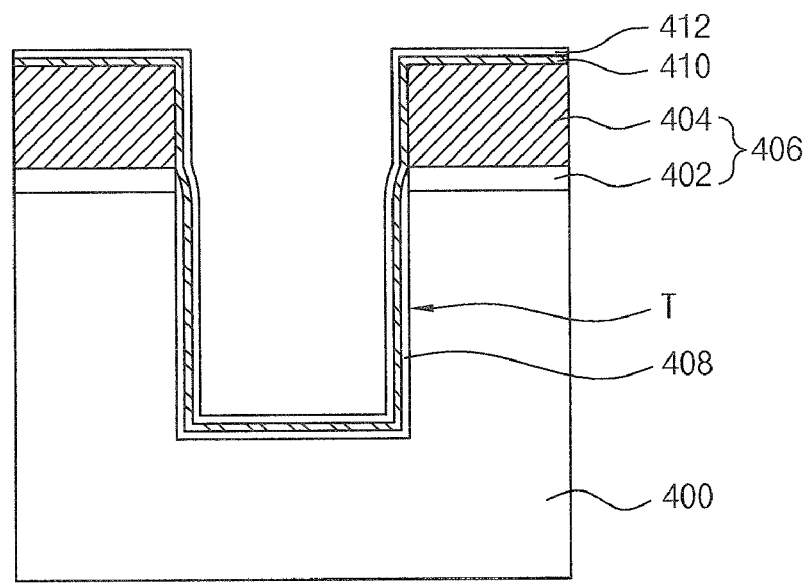

Referring to FIG. 4B, a sidewall oxide 408 is formed on the surfaces of a trench T through a thermal oxidation process. The sidewall oxide 408 is formed in a furnace at a temperature of 700~950° C. to a thickness of 50~200 Å. The generation of leakage current in the sidewalls of a trench T is suppressed by the presence of the sidewall oxide 408.

A linear nitride layer 410 and a linear oxide layer 412 are sequentially formed on the hard mask 406 including the sidewall oxide 408. The linear nitride layer 410 is formed in a furnace at a temperature of 400~900° C. to a thickness of 20~150 Å, and the linear oxide layer 412 is formed as a $SiO_2$ layer having a thickness of 20~250 Å through LP-CVD (low pressure-chemical vapor deposition) or ALD (atomic layer deposition).

When subsequently implementing an annealing process, a phenomenon in which water vapor leaks into the semiconductor substrate 400 is prevented by the linear nitride layer 410. The adhesion force between an insulation layer to be subsequently formed to fill a trench and the linear nitride layer 410 is reinforced by the linear oxide layer 412.

The insides of a trench T of the semiconductor substrate 400, which is formed with the linear oxide layer 412, are cleaned. The cleaning is implemented using at least one solution among SC-1 (standard cleaning 1) solution, BOE (buffer oxide etchant) solution, HF (hydrofluoric acid) solution, and SPM (sulfuric acid peroxide mixture) solution. The insulation layer to be subsequently formed to fill a trench can be uniformly coated in a trench T due to the cleaning.

Figure 4C:
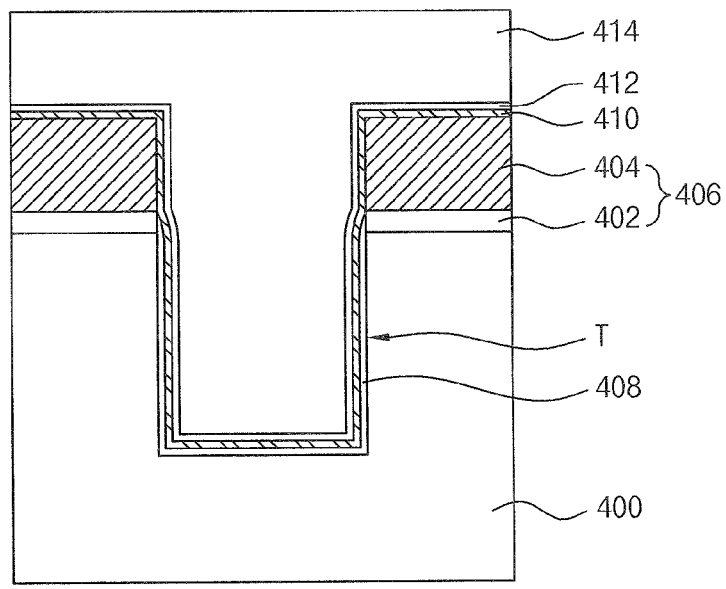

Referring to FIG. 4C, perhydro-polysilazane 414 is coated on the linear oxide layer 412 to fill a trench T. The perhydro-polysilazane 414 is a solution in which polysilazane is contained as a solute, and is coated through SOD.

Figure 4D:
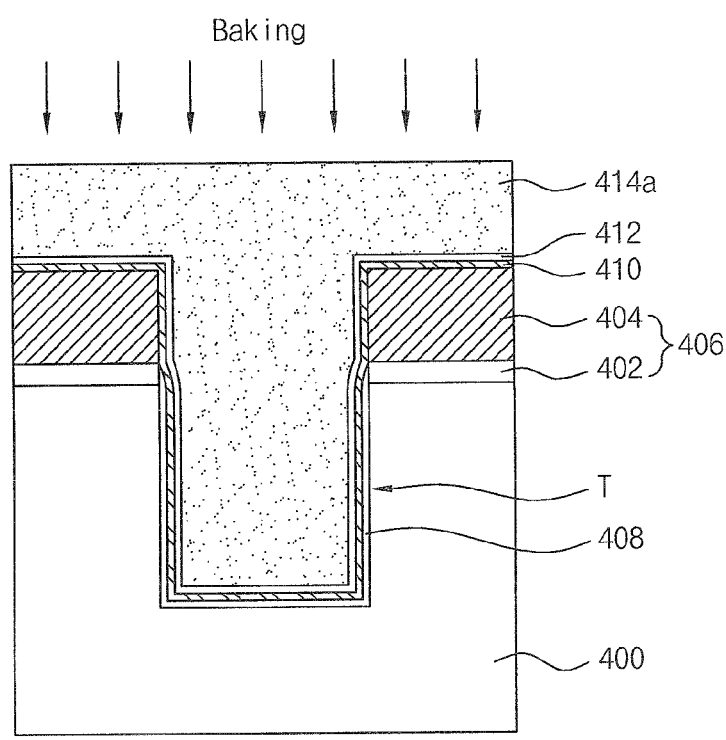

Referring to FIG. 4D, the perhydro-polysilazane 414 is baked. The baking is implemented at a temperature of 50~150° C. for 1~10 minutes. The solvent contained in the perhydro-polysilazane 414 volatilizes by the baking, and as a result, the perhydro-polysilazane 414 is converted into a PSZ layer 414a.

Figure 4E:
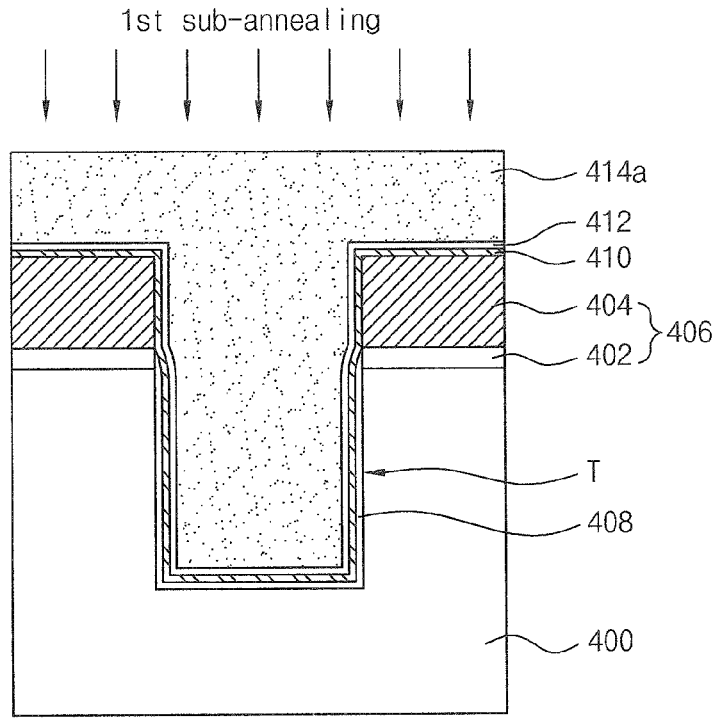

Referring to FIG. 4E, the semiconductor substrate 400 formed with the PSZ layer 414a is loaded into a furnace at a temperature of 150~200° C., and annealing is then implemented. The annealing is implemented at least three times such that the stress induced in the semiconductor substrate 400 can be decreased.

The PSZ layer 414a is first annealed through wet annealing in an $H_2O$ atmosphere. The first annealing comprises first sub-annealing, second sub-annealing and third sub-annealing. The first sub-annealing is implemented at a temperature of 300~400° C. under a pressure of 300~700 Torr for 30~120 minutes. Here, the first sub-annealing can be implemented two times, and in this case, preferably, each first sub-annealing is implemented for 15~60 minutes.

Figure 4F:
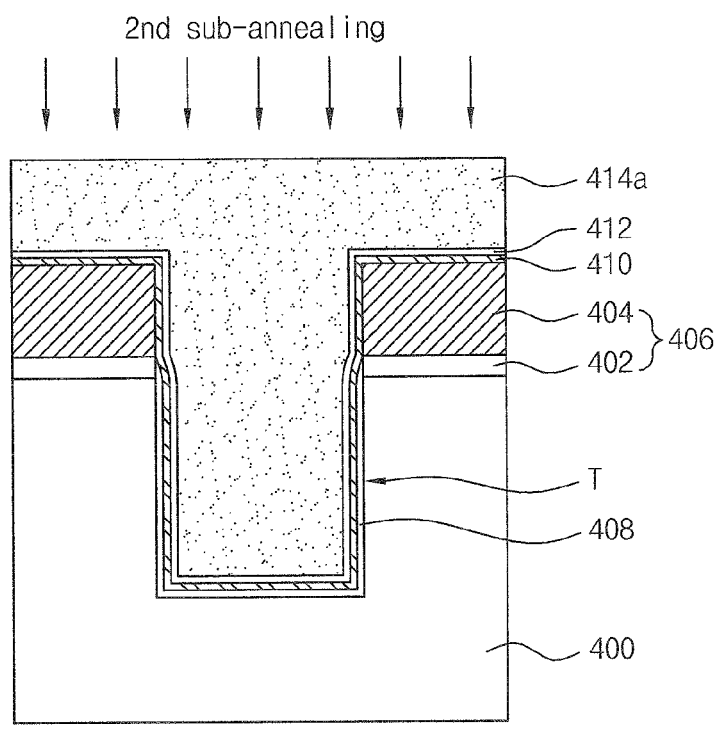

Referring to FIG. 4F, the PSZ layer 414a having undergone the first sub-annealing is second sub-annealed through wet annealing in an $H_2O$ atmosphere. The second sub-annealing is implemented at a temperature of 600~700° C. under a temperature of 400~760 Torr for 20~120 minutes.

Figure 4G:
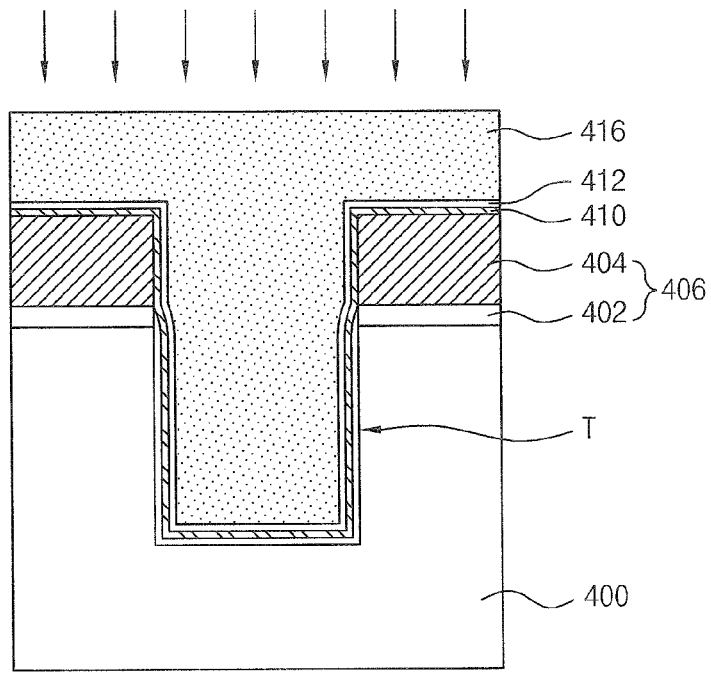

Referring to FIG. 4G, the PSZ layer 414a having undergone the second sub-annealing is third sub-annealed through wet annealing in an $H_2O$ atmosphere. The third sub-annealing is implemented at a temperature of 800~950° C. under a pressure of 400~760 Torr. The PSZ layer 414a is oxidated through the first, second and third sub-annealing, and as a result, the PSZ layer 414a is converted into a $SiO_2$ layer 416.

Figure 4H:
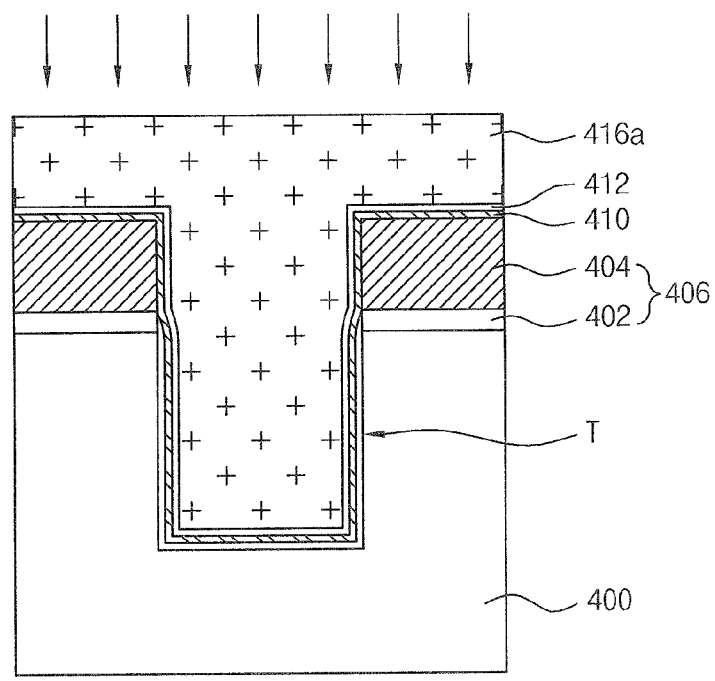

Referring to FIG. 4H, the $SiO_2$ layer 416 is second annealed, and a densified $SiO_2$ layer 416a is formed. The second annealing is implemented in an $N_2$ or $O_2$ atmosphere at a temperature of 850~980° C. for 5~120 minutes. The first and second annealing is implemented in situ. The semiconductor substrate 400 having undergone the second annealing is unloaded from the furnace at a temperature of 200~600° C.

Figure 4I:
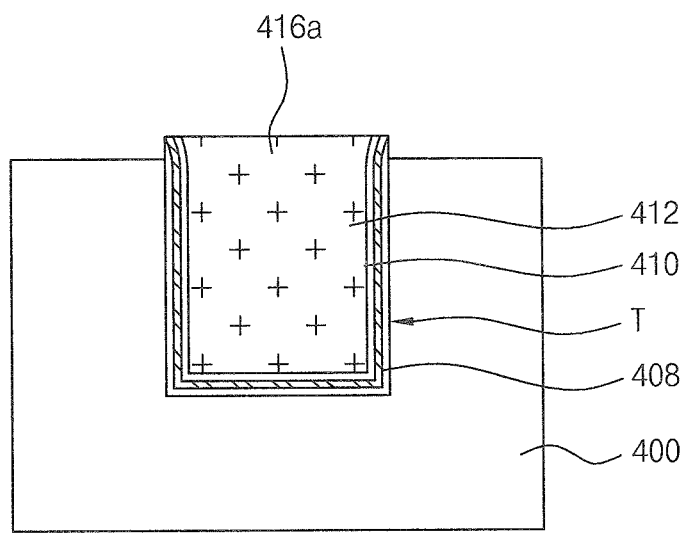

Referring to FIG. 4I, the densified $SiO_2$ layer 416a is removed until the hard mask 406 is exposed. The removal of the densified $SiO_2$ layer 416a is implemented through CMP. Then, the exposed hard mask 406 is removed.

Figure 4J:
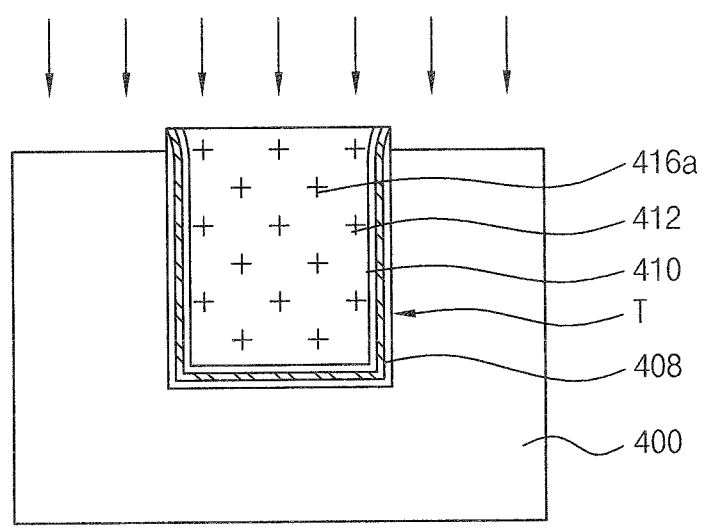

Referring to FIG. 4J, in order to increase the denseness of the densified $SiO_2$ layer 416a of the semiconductor substrate 400 from which the hard mask 406 is removed, the densified SiO₂ layer 416a is re-densified. The re-densification of the densified SiO₂ layer 416a is implemented in an N₂ or O₂ atmosphere at a temperature of 800~980° C. for 30~120 minutes.

Thereafter, while not shown in the drawings, by sequentially implementing a series of well-known subsequent processes, the formation of the device isolation structure of a semiconductor device according to this embodiment of the present invention is completed.

As is apparent from the above description, in the present invention, due to the fact that annealing of a PSZ layer is implemented at least three times, an abrupt temperature rise can be suppressed while implementing the annealing. Through this, in the present invention, it is possible to prevent stress from being induced in a semiconductor substrate while implementing the annealing.

Consequently, in the present invention, it is possible to prevent defects such as dislocation from occurring in the active region of the semiconductor substrate due to the stress. Accordingly, in the present invention, the characteristics of a semiconductor device can be improved and the manufacturing yield of the semiconductor device can increase.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for forming a device isolation structure of a semiconductor device, comprising the steps of:
    forming a hard mask pattern on a semiconductor substrate having active regions exposing a device isolation region of the semiconductor;
    etching the device isolation region of the semiconductor substrate exposed through the hard mask pattern, and therein forming a trench;
    forming a flowable insulation layer to fill the trench, wherein the flowable insulation layer is formed as a PSZ (polysilazane) layer,
    first annealing the PSZ layer in an atmosphere containing H₂O (water vapor) at least three times increasing the annealing temperature each time, so that the PSZ layer is converted into a SiO₂ layer;
    second annealing the SiO₂ layer as dry annealing, so that the SiO₂ layer is densified;
    removing the second annealed SiO₂ layer until the hard mask pattern is exposed;
    removing the exposed hard mask pattern; and
    densifying the flowable insulation layer.

2. The method according to claim 1, wherein, after the step of etching to form the trench and before the step of forming the flowable insulation layer to fill a trench, the method further comprises the steps of:
    forming sequentially a sidewall oxide, a linear nitride layer and a linear oxide layer on a surface of the semiconductor substrate; and
    cleaning the trench.

3. The method according to claim 2, wherein the cleaning is implemented using at least one solution among SC-1 (standard cleaning 1) solution, BOE (buffer oxide etchant) solution, HF solution, and SPM (sulfuric acid peroxide mixture) solution.

4. The method according to claim 1, wherein the step of forming the flowable insulation layer comprises the steps of:
    coating a flowable insulation layer through SOD (spin-on dielectric) to fill the trench; and
    baking the flowable insulation layer.

5. The method according to claim 4, wherein the baking is implemented at a temperature of 50~150° C. for 1~10 minutes.

6. The method according to claim 1, wherein the step of first annealing the flowable insulation layer at least three increasing the annealing temperature each time comprises the steps of:
    first sub-annealing the flowable insulation layer at a temperature of 300~400° C.;
    second sub-annealing the first sub-annealed flowable insulation layer at a temperature of 600~700° C.; and
    third sub-annealing the second sub-annealed flowable insulation layer at a temperature of 800~950° C.

7. The method according to claim 6, wherein the first sub-annealing is implemented under a pressure of 300~700 Torr for 30~120 minutes.

8. The method according to claim 7, wherein the first sub-annealing can be implemented two times and each first sub-annealing is implemented for 15~60 minutes.

9. The method according to claim 6, wherein the second sub-annealing is implemented under a pressure of 400~760 Torr for 20~120 minutes.

10. The method according to claim 6, wherein the third sub-annealing is implemented under a pressure of 400~760 Torr.

11. The method according to claim 1, wherein the semiconductor substrate formed with the flowable insulation layer is loaded into a furnace at a temperature of 150~200° C. to be first annealed and second annealed, and the semiconductor substrate having undergone the first annealing and the second annealing is unloaded from the furnace at a temperature of 200~600° C.

12. The method according to claim 1, wherein the step of second annealing the first annealed flowable insulation layer is implemented in an N₂ or O₂ atmosphere at a temperature of 850~980° C. for 5~120 minutes.

13. The method according to claim 1, wherein the step of first annealing the flowable insulation layer and the step of second annealing the first annealed flowable insulation layer are implemented in situ.

14. The method according to claim 1, wherein the step of removing the second annealed flowable insulation layer until the hard mask pattern is exposed is implemented using CMP.

15. The method according to claim 1, wherein the step of densifying the flowable insulation layer is implemented through annealing in an N₂ or O₂ atmosphere at a temperature of 800~980° C. for 30~120 minutes.

16. The method according to claim 1, wherein the step of first annealing the flowable insulation layer at least three times increasing the annealing temperature each time comprises:
    first sub-annealing the flowable insulation layer at a first sub annealing temperature;
    second sub-annealing the first sub-annealed flowable insulation layer at a second sub-annealing temperature higher than the first sub annealing temperature; and
    third sub-annealing the second sub-annealed flowable insulation layer at a third sub-annealing temperature higher than the second sub-annealing temperature.

* * * * *